(12) United States Patent
Karkkainen

(10) Patent No.: US 9,158,195 B2
(45) Date of Patent: Oct. 13, 2015

(54) CARBOSILANE POLYMER COMPOSITIONS FOR ANTI-REFLECTIVE COATINGS

(71) Applicant: Braggone Oy, Oulu (FI)

(72) Inventor: Ari Karkkainen, Oulu (FI)

(73) Assignee: BRAGGONE OY, Oulu (FI)

( * ) Notice: Subject to any disclaimer, the term of this patent is extended or adjusted under 35 U.S.C. 154(b) by 0 days.

(21) Appl. No.: 14/269,697

(22) Filed: May 5, 2014

(65) Prior Publication Data

US 2014/0239516 A1    Aug. 28, 2014

Related U.S. Application Data

(63) Continuation of application No. 12/741,708, filed as application No. PCT/FI2008/050637 on Nov. 6, 2008, now Pat. No. 8,765,899.

(60) Provisional application No. 60/985,845, filed on Nov. 6, 2007.

(51) Int. Cl.
| | |
|---|---|
| *C09D 183/04* | (2006.01) |
| *G03F 1/46* | (2012.01) |
| *C08G 77/52* | (2006.01) |
| *C09D 183/14* | (2006.01) |
| *G03F 7/075* | (2006.01) |
| *G03F 7/09* | (2006.01) |
| *C09D 5/00* | (2006.01) |
| *H01L 21/02* | (2006.01) |

(52) U.S. Cl.
CPC *G03F 1/46* (2013.01); *C08G 77/52* (2013.01); *C09D 5/006* (2013.01); *C09D 183/14* (2013.01); *G03F 7/0752* (2013.01); *G03F 7/091* (2013.01); *H01L 21/02118* (2013.01)

(58) Field of Classification Search
None
See application file for complete search history.

(56) References Cited

U.S. PATENT DOCUMENTS

| | | | | |
|---|---|---|---|---|
| 5,079,312 | A * | 1/1992 | Isozaki et al. | 525/479 |
| 5,489,662 | A * | 2/1996 | Wakamatsu et al. | 528/14 |
| 5,633,312 | A * | 5/1997 | Kabeta et al. | 528/14 |
| 6,376,634 | B1 * | 4/2002 | Nishikawa et al. | 528/25 |
| 7,955,660 | B2 * | 6/2011 | Rantala et al. | 427/387 |
| 2003/0017635 | A1 * | 1/2003 | Apen et al. | 438/29 |
| 2004/0110896 | A1 * | 6/2004 | Yoshioka et al. | 524/588 |
| 2005/0042538 | A1 * | 2/2005 | Babich et al. | 430/270.1 |
| 2005/0277058 | A1 * | 12/2005 | Iwabuchi et al. | 430/270.1 |
| 2006/0024980 | A1 * | 2/2006 | Tsuchiya et al. | 438/789 |
| 2006/0058487 | A1 * | 3/2006 | Rantala et al. | 528/33 |
| 2006/0293478 | A1 * | 12/2006 | Rantala et al. | 528/15 |
| 2006/0293482 | A1 * | 12/2006 | Rantala et al. | 528/35 |
| 2009/0061199 | A1 * | 3/2009 | Egami et al. | 428/304.4 |

* cited by examiner

*Primary Examiner* — Robert S Loewe
(74) *Attorney, Agent, or Firm* — McCormick, Paulding & Huber LLP

(57) ABSTRACT

A silicon polymer material, which has a silicon polymer backbone with chromophore groups attached directly to at least a part of the silicon atoms, the polymer further exhibiting carbosilane bonds. The film forming composition and resulting coating properties can be tailored to suit the specific exposure wavelength and device fabrication and design requirements. By using two different chromophores the refractive index and the absorption co-efficient can be efficiently tuned. By varying the proportion of carbosilane bonds, and a desired Si-content of the anti-reflective coating composition can be obtained.

2 Claims, 3 Drawing Sheets

CARBOSILANE POLYMER COMPOSITIONS FOR ANTI-REFLECTIVE COATINGS

CROSS-REFERENCE TO RELATED APPLICATIONS

This application is a continuation of U.S. patent application Ser. No. 12/741,708, having a filing date of Jun. 23, 2010, which further claims the benefit of International Patent Application No. PCT/FI2008/050637, filed on Nov. 6, 2008, and U.S. Patent Application No. 60/985,845, filed Nov. 6, 2007, all of which are incorporated by reference herein.

BACKGROUND OF THE INVENTION

1. Field of the Invention

The present invention relates to novel silicon-based compositions and the use thereof. In particular, the invention concerns novel film forming compositions that have properties suitable for anti-reflective coatings used in lithographic fabrication of semiconductor devices. The present invention also concerns methods of producing anti-reflective coatings on substrates.

2. Description of Related Art

There is a constant demand for decreasing the size of various features in semiconductor devices, e.g. integrated circuits (ICs). This demand creates challenges for the manufacturing processes. Photolithography is an example of a technique commonly used for the production of such devices and in particular for creating the patterns that define structures in ICs. In a lithographic process, a layer of a photoresist material is deposited on a substrate. The photoresist layer is selectively exposed to radiation, such as ultraviolet-light or electrons, and an exposure tool and mask are used for producing the desired selective exposure. The patterns in the resist are then created when the wafer undergoes a subsequent "development" step. The areas of resist that remain after development serve to protect the substrate regions which they cover. Locations from which resist has been removed can be subjected to a variety of subtractive or additive processes that transfer the pattern onto the substrate surface.

Generally, the substrate surfaces commonly used are highly reflective. The light-waves used in the exposure propagate through the photoresist film down to the substrate, and are reflected back up through the photoresist. This causes off-normal reflection effects and standing wave effects. These effects give rise to significant and critical variations in the dimensions of the patterns, and several techniques have been developed to suppress them, including the use of anti-reflective coatings (in the following also abbreviated "ARC"s) fitted below or above the resist layer. Methods that reduce reflectivity at the resist interfaces can provide line width control with minimal loss of resist performance. For example, anti-reflection coatings can be used to dampen the reflections. The reflections are suppressed either by attenuating the light that passes through the ARC, or by matching the index of refraction of the ARC to the resist system at the exposure wavelength employed such that destructive interference of the light passing through the ARC occurs. The use of ARCs has become essential for allowing optical-lithography to be used in fabrication of features smaller than 0.5 μm. The ARC layer needs to fulfil several properties, such as a predetermined extinction coefficient (k, ability to absorb energy of the radiation) at the used exposure radiation, refractive index (n), film thickness, dry and wet etching properties (compositional property), adhesion, process and material compatibility and stability of final material.

There is a need for new materials that will provide a combination of good optical properties and sufficient thermal and mechanical durability and strength.

SUMMARY OF THE INVENTION

It is an object of the present invention to provide new compositions for fabrication of anti-reflective coatings.

It is another object of the present invention to provide a new material composition for fabrication of an anti-reflective coating that meets stringent requirements for film thickness, refractive index and absorption co-efficient.

It is a third object of the invention to provide to a method of preparing an anti-reflective coating on a substrate.

It is a fourth object of the invention to provide a semiconductor component having an anti-reflective coating.

These and other objects, together with the advantages thereof over known methods and compositions, are achieved by the present invention as hereinafter described and claimed.

The present invention is based on the idea of producing anti-reflective coating materials from hybrid organic/inorganic materials, in particular silicon polymer compositions, which comprise organic side chains or groups attached to silicon atoms of the silane backbone. These compositions are synthesized by using organo-silane precursors where at least one chromophore sidegroup is directly attached to a silicon atom. The silicon atom of the monomeric precursor also contains one or more hydrolysable groups and it can be further polymerized to form a carbosilane/organo-siloxane polymer, which contains carbosilane bonds in the main-chain, in a side chain or in both and which optionally can be cross-linked via reactive groups attached to the silicon atoms or reactive groups present on the side groups or side chains.

Thus, the present chromophore precursors typically have a structure which comprises a segment or a residue with least two silicon atoms linked by a hydrocarbyl residue. That residue may, depending on the reaction of the silane precursor, be incorporated as a part of the carbosilane chain which will modify the properties of the chain or into a side-chain. As a result, the novel organic-inorganic silicone material has a backbone containing one or several of the following units: —Si—C—, —Si—C—Si—, —O—Si—C— and —Si—O— and further containing chromophore groups attached directly or via a linker, such as a hydrocarbon $((C)_x)$, amine (—NH—), or carbonyl (—CO—) linker to at least a part of the silicon atoms.

The material is synthesized by reacting silicon monomers, typically monomers of two or more different kinds in the presence of a suitable solvent and recovering the reaction product.

The present compositions can be used in lithographic processes for producing anti-reflective coatings on semiconductor components. The coating properties can be tuned by choosing the right composition.

The novel compositions can be employed in a process comprising the steps of

- coating the surface of a semiconductor device with a composition according to the invention to form a thin layer;
- employing a suitable substrate and applying a conventional deposition method, such as spin-coating;
- curing the coated layer in order to form an anti-reflective coating; and
- optionally coating on the anti-reflective coating layer further layers needed for the further steps of the lithographic process.

Considerable advantages are obtained by the present invention. Thus, the film forming composition and resulting coating properties can be tailored to suit the specific exposure wavelength and device fabrication and design requirements.

In the present invention it is possible to incorporate chromophore molecules as side groups into the base matrix and to use the silane residue of the chromophore precursor for forming the backbone of the polysilane material. There can be used chromophore molecules of one kind or of several different types in the same composition and there can be several chromophore per repeating unit of the polymer which is formed by polymerization or copolymerization of the precursor molecules. By using, for example, two different chromophores a greater freedom for tuning the n and the k indices and the Si-content of the anti-reflective coating composition can be obtained. A high Si-content will give good mechanical and thermal properties.

Next, the invention will be examined in greater detail with the aid of a detailed description with reference to the attached drawings.

Nämä pois!

DESCRIPTION OF PREFERRED EMBODIMENTS

Figure 1:
FIG. 1 shows in a sideview the cross-section of an antireflective coating comprising two thin film layers on a substrate.

The present invention relates to carbosilane/siloxane compositions that are obtained by polymerization or copolymerization of monomers having the formulas:

$$R^1\text{—}R^4\text{—}SiX_3 \qquad\qquad\qquad I$$

and $$R^1SiX_2\text{—}R^4\text{—}SiX_3 \qquad\qquad\qquad II$$

wherein $R^1$ is independently selected from the group of hydrogen, hydroxyl, linear and branched alkyl, alkoxy, alkenyl, alkynyl, epoxy, vinyl, tolyl, acryl, acrylate, alkyl (alk)acrylate and aryl groups having 1 to 6 rings, at least one of the $R^1$s of the polymer being a chromophore group;

each X represents independently a hydrolysable group or a hydrocarbon residue; and $R^4$ stands for an optional bivalent hydrocarbon linker, such as an alkylene group (—$CH_2$—)$_n$, wherein n is an integer 1 to 20, or an arylene group (e.g. a phenylene or naphthenylene group) or polycyclic group, which optionally carries an organic substituent or mixtures thereof.

Other suitable precursors are those having formulas III and IV:

$$R^2\text{—}R^4\text{—}SiX_3 \qquad\qquad\qquad III$$

and $$R^2SiX_2\text{—}R^4\text{—}SiX_3 \qquad\qquad\qquad IV$$

wherein $R^2$ is selected from the group consisting of hydrogen, linear and branched
- alkyl and cycloalkyl, alkenyl, alkynyl, (alk)acrylate and alkoxy and aryl groups having 1 to 6 rings,
- $R^2$ is selected from the group consisting of hydrogen, hydroxy, linear and branched alkyl and cycloalkyl, alkoxy, alkenyl, alkynyl, epoxy, vinyl, tolyl, acryl, acrylate, alkyl(alk)acrylate and alkoxy and aryl having 1 to 6 rings,
- each X has independently the same meaning as above and $R^4$ stands for an optional bivalent hydrocarbon linker, which optionally
- carries an organic substituent or mixtures thereof.

Typically, the siloxane polymer has a repeating —Si$(R^1_2)$—$R^4$—Si$(R^2_2)$—$R^4$— backbone, wherein substitutents $R^1$ and $R^2$ and $R^4$ have the same meaning as above.

For the purpose of the present invention, "chromophore" stands for any group typically containing at least two conjugated or isolated unsaturated bonds, in particular double bonds, preferably two or more conjugated double bonds. Particularly interesting chromophore groups are aromatic groups with one aromatic ring and aromatic groups with several isolated or fused aromatic rings (in the following also "polycyclic aromatic groups").

Examples of aromatic groups with one ring are phenyl and substituted phenyl derivatives.

The expression "polycyclic aromatic groups" encompasses isolated aromatic compounds comprising two or more aryl groups as well as aromatic groups wherein at least two aryl groups are fused together, such as naphthalene, anthracene, phenanthrene, pentacene or similar. Generally, the polycyclic group is selected from fused polycyclic hydrocarbons comprising 2 to 6 alicyclic, heterocyclic or, in particular, aromatic rings having 5 to 7 members, preferably 6 carbon atoms.

There can typically be 1 or 2 chromophore groups attached to each silicon atom.

Furthermore, each chromophore molecule can contain more than one site (carbon atom) where the silicon atom is attached. The chromophore groups are preferably directly attached to the silicon atom, although they may also be attached via a hydrocarbon, amine or carbonyl linker, as mentioned above. The hydrocarbon linker typically comprises a bivalent hydrocarbon chain, which is a linear or branched, saturated or unsaturated, aliphatic or cycloaliphatic group, or a bivalent aromatic group, such as an arylene group.

In addition to the above precursors—and optionally partly replacing any of them—the silane polymers can contain residues derived from monomers of the following formulas:

$$R^1_a SiX'_{4-a} \qquad\qquad\qquad V$$

and $$R^2_b SiX'_{4-b} \qquad\qquad\qquad VI$$

wherein $R^1$ and $R^2$ have the same meaning as above and each X' represents independently a hydrolysable group or a hydrocarbon residue; and a and b is an integer 1 to 3.

Further, residues derived from monomers of the formula VII can be included in the carbosilanes:

$$R^3_c SiX_{4-c} \qquad\qquad\qquad VII$$

wherein $R^3$ stands for hydrogen, alkyl or cycloalkyl which optionally carries one or several substituents, or alkoxy;

each X represents independently a hydrolysable group or a hydrocarbon residue having the same meaning as above; and c is an integer 1 to 3.

Specific examples of suitable compounds of Formula VII include triethoxysilane, methyltriethoxysilane, ethyltriethoxysilane, n-butyltriethoxysilane, methyldiethoxyvinylsilane, dimethyldiethoxysilane and tetraalkoxysilanes such as tetraethoxysilane.

The "hydrolysable group" (symbol X and X') in the above formulas generally stands for halogen (chlorine, fluorine, bromine), alkoxy (in particular $C_{1-10}$ alkoxy, such as methoxy, ethoxy, propoxy, or butoxy) or hydrogen or any other group that can easily be cleaved off from the monomer during condensation polymerization.

$R^1$, $R^2$, $R^3$ and $R^4$ are independently and optionally substituted by one or several substituents selected from fluoro, bromo, $C_{1-10}$-alkyl, $C_{1-10}$-alkoxy, $C_{1-10}$-alkenyl, $C_{6-18}$-aryl, acryl, epoxy, carboxyl and carbonyl groups. As will be discussed below, by incorporating a reactive group on the chromophore or other side group, such as an unsaturated group (vinyl, acryl) or an epoxy group it is possible to increase cross-linking of the material.

In the above formulas, the $C_{1-10}$-alkyl groups can be linear or branched or cyclic alkyl groups, optionally bearing at least one halogen substitutent, such as a chloro, bromo or fluoro substituent. In particular, the alkyl group is a lower alkyl containing 1 to 6 carbon atoms, which optionally bears 1 to 3 substituents selected from methyl and halogen. Methyl, ethyl, n-propyl, i-propyl, n-butyl, i-butyl and t-butyl are particularly preferred.

The "alkenyl" groups comprise monovalent, unbranched or branched hydrocarbon chains having one or more double bonds therein. The double bond of an alkenyl group can be unconjugated or conjugated to another unsaturated group. Suitable alkenyl groups include, but are not limited to, $C_2$ to $C_8$ alkenyl groups, such as vinyl, allyl, butenyl, pentenyl, hexenyl, butadienyl, pentadienyl, hexadienyl, 2-ethylhexenyl, 2-propyl-2-butenyl, 4-(2-methyl-3-butene)-pentenyl. The alkenyl group can be unsubstituted or substituted with one or two suitable substituents.

(Alk)acrylates include meth- and ethacrylate groups. Alkyl (alk)acrylates include for example methyl methacrylate and ethyl ethacrylate.

Preferred embodiments of the aryl groups include phenyl, which optionally bears 1 to 5 substituents selected from halogen, alkyl and alkenyl, on the ring, or naphthyl, anthrasyl, phenantryl, which optionally bear 1 to 11 substituents selected from halogen alkyl or alkenyl on the ring structure, the substituents being optionally fluorinated (including perfluorinated or partially fluorinated).

In the above, other substituents include acryl, epoxy, vinyl, carboxyl and carbonyl groups. Reactive functional substituents will provide for some cross-linking during polymerization of the monomers, forming bridges between adjacent polycyclic structures. The reactive functional substituents provide also the possibility to make the anti-reflective coating material also a photopatternable material.

"Alkoxy groups" have the formula $R^{50}$—, wherein $R^5$ stands for an alkyl as defined above. The alkyl residue of the alkoxy groups can be linear or branched. Typically, the alkoxy groups are comprised of lower alkoxy groups having 1 to 6 carbon atoms, such as methoxy, ethoxy and t-butoxy groups.

In some specific examples of compounds according to the above general formula, the hydrocarbyl residue stands for an unsubstituted or substituted fused hydrocarbon ring system selected from naphthalene, antracene, phenanthrene, and pentacene, phenanthrene and substituted derivatives thereof being particularly preferred.

In formulas I to IV, the bivalent linker typically comprises 1 to 10 carbon atoms. Examples of suitable linker groups $R^4$ include alkylene, alkenylene and alkynylene (including cyclic bivalent residues) as well as arylene groups. "Alkylene" groups generally have the formula —$(CH_2)_r$— in which r is an integer 1 to 10. One or both of the hydrogens of at least one unit —$CH_2$— can be substituted by any of the substituents mentioned below. The "alkenylene" groups correspond to alkylene residues, which contain at least one double bond in the hydrocarbon backbone. If there are several double bonds, they are preferably conjugated. "Alkynylene" groups, by contrast, contain at least one triple bond in the hydrocarbon backbone corresponding to the alkylene residues. The polycyclic aliphatic groups include residues derived from ring structures having 5 to 20 carbon atoms, such as norbornene (norbornenyl) and adamantyl (adamantylene). "Arylene" stands for bivalent aryls comprising 1 to 6 rings, preferably 1 to 6, and in particular 1 to 5, fused rings, such as phenylene, naphthylene and anthracenyl.

The linker groups can be unsubstituted or substituted. The substitutents are preferably selected from the group of fluoro, bromo, $C_{1-10}$-alkyl, $C_{1-10}$-alkenyl, $C_{6-18}$-aryl, acryl, epoxy, carboxyl and carbonyl groups.

Based on the above, the present materials typically comprise an organic-inorganic siloxane material that has a backbone containing one or several of the following bonds: —Si—C—, —Si—C—Si—, —O—Si—C— and —Si—O— and further containing chromophore groups attached directly or via a hydrocarbon, amine, or carbonyl linker to at least a part of the silicon atoms. It may comprise a $(R^1{}_2)$—C—Si$(R^2{}_2)$—C— backbone, wherein each $R^1$ is independently selected from the group of hydrogen, linear or branched alkyl, alkenyl, alkynyl acryl, acrylate, aryl, polyaromatic and polycyclic groups, at least one of the Fes being a chromophore group, and wherein each $R^2$ is independently selected from the group of hydrogen, alkyl, alkenyl, alkynyl, acryl, acrylate, aryl, polyaromatic and polycyclic groups.

It can further comprise —Si—$(C)_x$—Si— bonds. The linking group —$(C)_x$— is independently alkyl, alkenyl, alkynyl, acryl, acrylate, aryl, polyaromatic or polycyclic group. For example a polycyclic group and containing 1 to 25 carbon atoms, i.e. x stands for 1 to 25.

The present organo-silicon compounds can be polymerized to form polymeric silicon dioxides, i.e. silicones. These polymers are particularly attractive as antireflective film applications.

The cycloalkyl and aryl groups may have different organic and/or inorganic groups attached. The groups $R^{1-3}$ are covalently attached to the silicon atom. To construct a composition it is possible to use two (or even one) of the above-mentioned monomers. In many situations it is preferable to apply even the all four (or more) monomers to form the composition.

Generally speaking, the novel carbosilane polymers may contain the following residues:

Residue A: Base siloxane polymer matrix former
Residue B: Refractive index (n) modification by selection of the organic side group $R^1$
Residue C: Absorption co-efficient (k) modification by selection of the organic side group $R^2$; and
Residue D: Base matrix property modifier by selection of the organic group $R^4$ or $R^3$ The respective proportions in moles of the monomers can vary in the range of
Residue A: 0 to 100 parts, in particular 0 to 50 parts;
Residue B: 1 to 50 parts, in particular 5 to 50 parts;
Residue C: 0 to 50 parts, in particular 1 to 50 parts; and
Residue D: 1 to 50 parts, in particular 5 to 50 parts.

Particularly preferred is to have a ratio of Residue B+Residue C to Residue A+Residue D of 10:1 to 1:10. The residues D can be selected from two or more kinds of monomers having different kinds of substitutents R³ and substitutents R⁴.

It is also preferred to have a ratio of Residue B to Residue C of 10:1 to 1:10.

By varying the proportion of carbosilane bonds (e.g. —C—Si— or —Si—C—Si—) in the material, the silicon concentration can be efficiently adjusted. Generally, the proportion of carbosilane bonds is about 1 to 20 mole-%, typically about 2 to 10 mole-%, based on the proportion of monomers forming such bonds to the total molar amount of monomers.

To give one example of a suitable carbosilane/siloxane polymer which is based on a siloxane material matrix, a polymer comprising repeating units derived from the following precursors can be mentioned:
  a. phenanthrene trialkoxysilane that absorbs light at below 350 nm wavelength; and
  b. naphthalene trialkoxysilane; or
  c. phenyl trialkoxysilane; or
  d. methyl trialkoxysilane; or
  e. ethyl trialkoxysilane; or
  f. tetra alkoxysilane; or
  g. hydrogen trialkoxysilane; or
  h. dimethyl dialkoxysilane: or
  i. any combination of (a)-(f) or (a)-(h).

By using monomers of formulas I to III it is possible to produce an absorbing organo-siloxane polymer which comprises an organic chromophore covalently attached to the silicon atom and second organic compound also attached directly to silicon and to an alternative polymer matrix former with a hydrocarbyl linker connecting at least two of the silicon atoms of the matrix or linking one silicon atom with a further organic group.

A composition according to the invention may comprise the hydrolyzed or partially hydrolyzed product of a combination of silanes including
(a) an alkoxysilane, acyloxy or chloro silane having at least one hydrocarbon group attached directly to the Si atom which hydrocarbon group contains a non-aromatic, saturated or non-saturated hydrocarbon group in a 0 to 98 mole percent based on total moles of silanes present,
(b) an alkoxycarbodisilane, acyloxycarbodisilanesilane or chlorocarbodisilane having at least one hydrocarbon group attached directly to one of the two Si atom of carbodisilane which hydrocarbon group includes an aromatic ring, and
(c) and alternative group silane of tetra alkoxy, acyloxy or chlorosilane in an 0 to 98 of mole percent based on total moles of silanes present.

The composition may further comprise (d) an alkoxysilane, acyloxysilane or chlorosilane having at least one $C_1$-$C_6$ crosslinking group attached directly to the Si atom.

The composition may comprise the hydrolysis product of 5-98 mole %, preferably about 10 to 40 mole percent, silanes of the formula

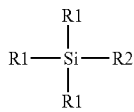

wherein R1 is alkoxysilane, acyloxy or chloro silane and R2 is hydrogen, methyl, ethyl, propyl or butyl, vinyl, allyl group, (b) 1 to 30 mole percent, preferably 1 to 20 mole percent, of carbodisilane

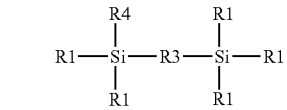

wherein R1 is alkoxysilane, acyloxy or chloro silane, R3 is methylene, ethylene or propylene, arylene, bridging group and R4 is aromatic or polyaromatic group, and
(c) 0 to 98 mole percent, preferably 20 to 60 mole percent,

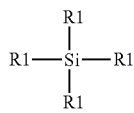

wherein R1 is tetramethoxysilane, tetraethoxysilane, tetrapropoxysilane, tetrabutoxysilane, tetraacyloxysilane or tetracholosilane.

The cross-linking group of monomer (d) is for example selected from the group of styrene, $C_2$-$C_6$ alkenyl, $C_{2-6}$ alkynyl, 3-methacryloxy, 3-acryloxy, 3-aminoethyl-amino, 3-amino, and epoxy containing hydrocarbon group.

The first silane (a) is for example a hydrogen, methyl or vinyl alkoxysilane and the second silane (b) is an 1-(9-Phenanthrenyl)-1,1,4,4,4-pentamethoxy-1,4-disilanebutane or 1-(phenyl)-1,1,4,4,4-pentamethoxy-1,4-disilanebutane or 1,1,1,4,4,4-pentamethoxy-1,4-disilanephenylene.

In another embodiment, the first silane (a) is a hydrogen, methyl or vinyl alkoxysilane and the second silane (b) is an 1-(9-Phenanthrenyl)-1,1,4,4,4-pentaethoxy-1,4-disilabutane, 1-(phenyl)-1,1,4,4,4-pentaethoxy-1,4-disilabutane or 1,1,1,4,4,4-pentaethoxy-1,4-disilaphenylene.

In still a further embodiment, the first silane (a) is a hydrogen, methyl or vinyl chlorosilane and the second silane (b) is an 1-(9-Phenanthrenyl)-1,1,4,4,4-pentachloro-1,4-disilabutane, 1-(phenyl)-1,1,4,4,4-pentacholoro-1,4-disilabutane or 1,1,1,4,4,4-pentacholoro-1,4-disilaphenylene The composition may exhibits typically a silicon w-% higher than 40% and preferably up to 45%.

As an example, we shall in the following discuss the guidelines for designing an organo-siloxane polymer material useful in the production of a coating which exhibits anti-reflective properties measured at an exposure wavelength of 193 nm. The production takes place by conventional semiconductor fabrication.

In general, the following considerations are or may be relevant:
(A) The material should be compatible with spin-on deposition tools that are used in semiconductor industry manufacturing;
(B) The processing solvent should be of the kind which is commonly applied, or which is suitable for use, as a processing solvent in the semiconductor industry, such as propyleneglycol monomethylether acetate, PGMEA, PnP, PGME);
(C) The shelf-life of the material should be on an adequate level to allow for storage of that material as a solution for 3-6 months at room temperature; and
(D) The material has to be compatible with the underlying substrate and also with the used photoresist material. This compatibility requirement means that the thin film formed from the organo-siloxane material has to have suitable adhesion properties to the substrate and photoresist.

Furthermore, (E) as regards the shelf-life (point C above), the stability can be monitored by determining, for example, the following properties:

Film thickness (e.g. a maximum thickness change of 3% over the 3 month period);
Film refractive index;
Film absorption co-efficient;
FTIR-measurements from the films and following the characteristic peaks for the material;
Viscosity of the material solution;
Molecular weight of the material;
GC measurements to analyse possible compositional changes; and
Liquid particle counting to measure possible increased particle levels Further, the cured organo-siloxane film should preferably have a proper resistance against the photoresist processing solvent so that it is not dissolved in it when the photoresist layer is deposited. The film should also be resistant against the photoresist development solutions, e.g. against a 2.38% TMAH-solution. The organo-siloxane film has to be fully cured at e.g. 250° C. (max. 300° C.) and essentially no outgassing of the material components is allowed in the following process steps. The deposited and cured siloxane film has to be also defect free.

Out-gassing of any components of the material will impair the following photoresist deposition, curing, exposure and development steps. Out-gassing may affect the photoresist curing properties and subsequently give rise to critical variations in the formation of the photoresist pattern. It is also desirable that the organo-siloxane film has a proper adhesion to the photoresist interface but still it is possible to remove the residual layer in the photoresist development step. Adhesion to the photoresist interface plays also a role in under-cut and footing generation in the photoresist structures.

Preferably, the organo-siloxane material also fulfils certain optical property requirements:

The optical property requirements are dependent on the specific semiconductor manufacturing/device designs and for this reason they vary case by case. As an example: at the 193 nm exposure wavelength, the refractive index (n) of the cured organo-siloxane material layer could be in the range of 1.6 to 1.7 and the absorption co-efficient (k) of the cured organo-siloxane material layer could be in the range of 0.1 and 0.3; the optical properties of the organo-siloxane material are dependent on the composition of the material and for this reason directly on the used precursor molecules.

When depositing a thin film using the organo-siloxane material it has to result in certain film thickness. It is also required that the material can be deposited to several film thicknesses by varying the deposition parameters and/or the solid content of the solution. The film thickness requirements are also dependent on the specific semiconductor manufacturing/device designs and for this reason vary case by case. The required film thickness value of the cured organo-siloxane material layer can be example between 20 nm and 200 nm.

The deposited and cured organo-siloxane material has to also fulfill certain dry and wet etching properties. The desired etch rates are also dependent on the specific semiconductor manufacturing/device designs and for this reason vary case by case. The required etch rate for the cured organo-siloxane material layer can be, for example 1000 nm/minutes (wet etching, 25% TMAH, 80° C.). The etching properties of the organo-siloxane material are dependent on the composition of the material and for this reason directly on the used precursor molecules. The etching properties can be also described in terms of organic and inorganic (silicon) content of the organo-siloxane material. To mention an example: the typical required silicon content of the organo-siloxane material layer can be between 30 and 45% [in atom weight % of the final material compositions; as an example pure $SiO_2$ the silicon content is 46.7% (28.09/60.09*100%=46.7%)]. In some cases it is very favorable if it is possible to achieve silicon content values close to 40%. Obviously, when aiming at a material with a very high silicon content, then the final composition should be brought close to $SiO_2$. This would mean that you would have to synthesize the siloxane polymer material using a maximum amount of example tetra-alkoxysilane [e.g. $Si(OEt)_4$] as the precursor. In this composition the amount of "organic atoms" (e.g. C, H, N, etc.) that would stay in the final cured siloxane material layer is minimized. As an example if we would use methyl trialkoxysilane [e.g. $CH_3—Si(OEt)_3$] as the precursor molecule, the final cured siloxane material layer would contain the organic $CH_3$-groups [one (1) carbon and three (3) hydrogen atoms per one silicon atom] attached to the silicon dioxide backbone and would result in a lower silicon content material than in the case of the tetra-alkoxysilane example. As another example when using phenanthrene trialkoxysilane [e.g. $C_{14}H_9—Si(OEt)_3$] as the precursor molecule in the synthesis, the final cured siloxane material layer would contain the organic $C_{14}H_9$-groups [fourteen (14) carbon and nine (9) hydrogen atoms per one silicon atom] attached to the silicon dioxide backbone and would result in considerably lower silicon content material than in the case of the tetra-alkoxysilane example.

Although a composition would give the required high silicon content (tetra-alkoksysilane example) it would not necessarily give the right optical properties of the cured material layer. As a conclusion, it is necessary to balance all of the above-mentioned properties to obtain a fully functional organo-siloxane polymer material that can be applied as an anti-reflective coating in a semiconductor fabrication process. This can be achieved by selection of the proper precursor molecules (utilize the properties of each precursor) for the synthesis and also a proper synthesis method and technique for the polymerization of the final organo-siloxane polymer material.

As can be seen from the organo-siloxane polymer examples to be presented below it is advantageous to use chromophore groups such as, phenanthrene, naphthalene and phenyl groups in the final organo-siloxane material because of the resulting beneficial optical properties. As discussed above, a functional anti-reflective composition has to have high silicon content and in light of this the chromophore group content should be minimal and optimized. Also when designing and synthesizing the chromophore precursor molecules for the siloxane polymer synthesis, we have to keep in mind that we do not want to add any unnecessary additional organic molecules to the chromophore groups (that would further lower the silicon content).

Also in the case of a carbosilane material it is possible to apply a combined plasma etching and wet etching techniques in the lithographic processing instead of using only the wet etching or dry etching. This is possible since some of the carbosilane groups may be cleavable by plasma etching, but not with wet etching e.g. in TMAH. This may give some advantages when designing the processing and device manufacturing sequences.

In view of the above, in the present invention methods have been developed for the synthesis of chromophore alkoxysilane precursor molecules, wherein the silicon atom is attached directly to the chromophore molecule. As an example, precursor molecules like phenanthrene trialkoxysilane and naphthalene trialkoxysilane can be synthesized using a Grignard-synthesis method. This way the silicon atom can be attached directly to the chromophore molecule. Thus, for example, reacting 9-bromophenanthrene and tetra-ethoxysilane using the Grignard synthesis method results in phenanthrene-9-triethoxysilane as a synthesis product. By using this method a wide variety of organo-silane precursor molecules can be synthesized that can be then utilized in the synthesis of the final siloxane polymer compositions.

Furthermore, it is possible to attach more than one reactive silane atom to a chromophore molecule by using the same synthesis technique. When a chromophore molecule has two reactive silane sites the molecule is more reactive during the hydrolysis and condensation reactions. The molecule's reactivity also varies depending which type of alkoxy- or halo-silane is used. It is important to make sure that the used chromophore precursor molecules are readily reactive in the used condensation polymerization and no low molecular weight species and/or on the other hand too high molecular weight species are formed during the polymerization. If the final polymer product contains both higher and lower molecular weight species, this in general leads to a low shelf-life material. Furthermore, it is very difficult to make this kind of polymerization as repeatable synthesis method. In addition to the precursor molecules reactivity the used final siloxane polymer's synthesis technique and method affects a great deal to the molecular weight distribution of the final material. Because of this, even if the precursor molecule's optical properties (n and k) would be optimal to be used in the final siloxane polymer composition it may not be suitable to be used in the synthesis due to it low reactivity. The chromophore molecules can be also further substituted with different groups to modify the optical properties (n and k values) of the resulting chromophore precursor molecule.

Generally the synthesis of the siloxane polymer anti-reflective material consists of two steps: In the first synthesis step the precursor molecules are hydrolyzed in presence of water and a catalyst, preferably an acid catalyst, for example a mineral acid such as hydrochloric acid, nitric acid, acetic acid, sulphuric acid or phosphoric acid, or an organic acid such as a sulphonic acid (toluene sulphonic acid), or a solid acid ionexchange resin, and in the second step, the material's molecular weight is increase by condensation polymerization.

The synthesis is carried out in a synthesis solvent or a mixture of solvents. Suitable solvents for the synthesis are, for example, acetone, THF, toluene, 2-propanol, methanol, ethanol, methyl-tert-butylether (MTBE), PnP, propyleneglycolmonomethylether (PGME), and propyleneglycolmonomethylether acetate (PGMEA).

First, the precursor, optionally water, catalyst and synthesis solvent(s) mixture are refluxed for 1-5 hours. The precursor is preferably a monomer according to any of Formulas I to VII above. Typically 2 to 8, preferably 3 or 5 different kinds of monomers according to the above formulas are used.

After this the synthesis solvent(s), water and other by-products, such as alcohols, are removed using distillation and solvent exchange process to a higher boiling point solvent(s). In a second synthesis step, the material is further refluxed in a higher boiling point solvent(s) for 1-5 hours. During the second synthesis step, the molecular weight of the material is increased due to condensation polymerization. After the second step, the reaction by-products, such as water and alcohols, may be removed using distillation. Also the used higher boiling point solvent(s) can be changed to another solvent that is required to be used in the deposition process. Mixtures of two or more solvents can also be used as processing solvent. During the synthesis it is possible to use certain stabilizer solvents or additives or they can be added in the end of the synthesis to the final synthesized material to improve material shelf-life. The synthesized material is then diluted using a proper solvent or solvent combination to result in desirable film thickness. Film thicknesses may range e.g. from 5 nm to 2 µm. The final anti-reflective coating film thickness has to be optimized according for each device fabrication process. When using, for example, PGMEA as the synthesis solvent in one or both of the above-described the synthesis steps, we do not have to necessarily change solvent for the final material, since PGMEA is regularly used also as a processing solvent in the semiconductor industry. This makes the synthesis procedure of the material easier and less time consuming. Other processing solvent include PGME, NBA, NPA, PnP, 2-propanol and water.

A thermal stability of at least 250-300 degrees for the solvent is required.

When the monomers are polymerized, a silicon material will be obtained which exhibits several of the following units: —Si—C—, —Si—C—Si—, —O—Si—C— and —Si—O— and further contains chromophore groups attached directly or via a linker, such as a hydrocarbon $((C)_x)$, amine (—NH—), or carbonyl (—CO—) linker to at least a part of the silicon atoms.

The synthesized end product has a suitable form to have enough reactive cross-linking sites that are able to react further during the processing and curing of the material film on a substrate. Already during synthesis, the product will, however, be subjected to cross-linking. In particular, the condensation product is subjected to partial cross-linking through vinyl, acrylate or epoxy groups.

Generally, organo-silicon compounds having three leaving groups, in particular three halo groups, will give rise to a higher degree of cross-linking than organo-silicon compounds with two leaving groups. Cross-linking will also take place via substitutent groups attached to the organic moieties.

The polymerized material will have a molecular weight of about 500 to 500,000 g/mol, typically about 1000-30,000 g/mol. The higher the molecular weight, the thicker layer is obtained at the same dilution of the spinning liquid.

The combinations of absorbing compounds used give a possibility to adjust the final material properties to an appropriate level. The employed chromophore combinations have strong absorption bands at wavelengths used in photolithography exposure tools and this way may enable application of these materials as anti-reflective coating layers in manufacturing of the semiconductor devices.

Typically, the refractive index (n) of the anti-reflective material layer lies within the range from 1.5 to 1.8. The absorption co-efficient (k) of the anti-reflective material layer may vary in the range between 0.1 and 0.5. Typical parameter for the film thickness of the anti-reflective material layer may lie in the range from about 5 nm to about 1000 nm, in particular about 10 to 500, preferably about 20 to 300 nm. Typically the silicon content of the anti-reflective material layer ranges between 20 and 50% of the weight of the material, preferably between about 30 and 45%.

Without going into details of the lithography process used in manufacturing of the semiconductor devices or into details of the device structures, a general description of using the siloxane polymer compositions described in the present invention as an antireflective coating is described in FIG. 1. In connection with the lithography processes it may be preferable to use additives, such as surfactants (example Byk-306 or similar) and photoacid generators (example Ciba Specialty Chemicals PAG's such as Irgacure PAG 103 and CGI-1906 or similar) in the presented antireflective coating composition to improve their compatibility with the substrate and the used photoresist material and to improve the result in the lithographic processing.

The substrate 110 shown in FIG. 1 can consist of any material, e.g. a silicon wafer on which the siloxane polymer anti-reflective layer 120 is desirable to be deposited. The substrate (e.g. silicon wafer) may comprise at least one dielectric layer (either organic or inorganic) and a plurality of other layers or structures that are absorbing or transparent, conductive, semi-conductive or insulating materials. The siloxane polymer anti-reflective layer 120 is deposited on top of the substrate 110, which is then coated with a photoresist layer 130. This stack is then selectively exposed to some form of radiation, such as ultraviolet-light or electrons and other necessary lithographic processing is applied. The anti-reflective layer 120 is used to cancel out or diminish the reflections from the substrate 130 (silicon wafer or other reflecting layers) that can cause unwanted variations in the exposed resist profile (standing waves) and swing curve effects leading to degradation of a critical dimension. The anti-reflective layer 120 may also work as a hard mask in the subsequent etching processes used in the semiconductor device fabrication steps.

The siloxane polymer anti-reflective coatings 120 are deposited on substrate 110 surfaces using typically a conventional spin coating deposition technique. Other liquid phase deposition methods may also be applied depending on the application and process needs. A typical spin coating deposition procedure includes a dispensing step, a spread spin step and a thickness spin step followed by an edge bead removal step (EBR). Typical thickness spin speeds range between 1500 and 3500 rpm for about 30 seconds. The coated wafers are then baked on a hot-plate (inert atmosphere or air). The hot-plate baking procedure may consist of either one or two (or more) separate bakes at different temperatures. It would be preferable to use only a single baking step. The bake temperatures may range from 100° C. to 300° C. and each bake step time may last between 30 s and 120 s. After the hot-plate bake step the substrate 110—anti-reflective coating 120 stack is now ready for further processing such as photoresist deposition. When depositing the antireflective coating material on a substrate or on the other hand when depositing example a photoresist on the anti-reflective coating layer it may be preferable to use surface treatments to improve and/or modify material spreading and adhesion on the surface of the underlying material. In case of anti-reflective coating—photoresist interface it is desirable to have a proper adhesion but still be able to get rid of the residual layer in the photoresist development step. Adhesion also plays a role in under-cut and footing structure formation in the exposed photoresist structures.

Table 1 below summarizes the properties of the synthesized compositions. The measured parameters were film thickness, refractive index (n) and absorption co-efficient (k). The thickness and n and k measurements were performed from cured material films (deposited on silicon substrates) using a GES5-PUV spectroscopic ellipsometer. The measurements were performed at an incident angle of 76 degrees. Winelli_II was used for the spectral fitting. The used spectral range in the measurement was 150 nm-650 nm. FIGS. 1-4 represent the spectral plots of n and k as a function of wavelength (nm) and energy (eV). Table 1 represents the characteristic n and k values for 157 nm, 193 nm, 248 nm and 633 nm wavelengths. The silicon content (%) values in the Table 1 are calculated theoretical values. These calculations are based on the atom weights of the final compositions. As an example for pure $SiO_2$ the silicon content is 46.7% (28.09/60.09*100%=46.7%).

TABLE 1

| Sample name | Film thickness (nm) | Silicon content (%) | 157 nm | | 193 nm | | 248 nm | | 633 nm | |
|---|---|---|---|---|---|---|---|---|---|---|
| | | | n | k | n | k | n | k | n | k |
| Example 1 | 53.3 nm | 31.0% | 1.486 | 0.1314 | 1.839 | 0.7635 | 1.674 | 0.0033 | 1.53 | 0.0006 |
| Example 2 | 52.2 nm | 34.8% | 1.528 | 0.107 | 1.813 | 0.5901 | 1.628 | 0.0011 | 1.506 | 0.0011 |
| Example 3 | 55.9 nm | 29.3% | 1.461 | 0.1428 | 1.649 | 0.3585 | 1.517 | 0.2983 | 1.507 | 0.0067 |
| Example 4 | 41.1 nm | 35.6% | 1.483 | 0.1183 | 1.628 | 0.329 | 1.5 | 0.2291 | 1.475 | 0.0062 |
| Example 5 | 48.2 nm | 41.9% | 1.581 | 0.0623 | 1.708 | 0.2568 | 1.534 | 0.0037 | 1.459 | 0.0017 |
| Example 6 | 45.5 nm | 31.6% | 1.466 | 0.1352 | 1.55 | 0.2593 | 1.471 | 0.3501 | 1.482 | 0.0082 |
| Example 7 | 43.7 nm | 17.4% | 1.375 | 0.2281 | 1.507 | 0.377 | 1.478 | 0.6417 | 1.568 | 0.0143 |
| Example 8 | 53.0 nm | 21.3% | 1.382 | 0.2232 | 1.524 | 0.3709 | 1.513 | 0.631 | 1.593 | 0.013 |
| Example 9 | 50.4 nm | 37.4% | 1.596 | 0.1023 | 1.655 | 0.2366 | 1.503 | 0.106 | 1.459 | 0.0034 |
| Example 10 | 43.0 nm | 39.0% | 1.518 | 0.085 | 1.635 | 0.2722 | 1.489 | 0.1137 | 1.44 | 0.005 |

To summarize, the compositions represented in Table 1 have:
- a Si-content (theoretical) of 17.4% to 41.9%;
- a refractive index (n) of 1.382-1.581 at 157 nm, 1.507-1.839 at 193 nm, 1.471-1.674 at 248 nm and 1.44-1.593 at 633 nm; and
- an absorption co-efficient (k) of 0.0623-0.2281 at 157 nm, 0.2366-0.7635 at 193 nm, 0.0011-0.6417 at 248 nm and 0.0006-0.0143 at 633 nm.

Vanhoja esimerkkejä

By tuning the composition it is possible to vary the material properties. Obviously other composition variations can be synthesized based on these methods and wide range of properties can be achieved.

In the following we analyze the synthesized siloxane polymer materials based on their composition.

Figure 2:
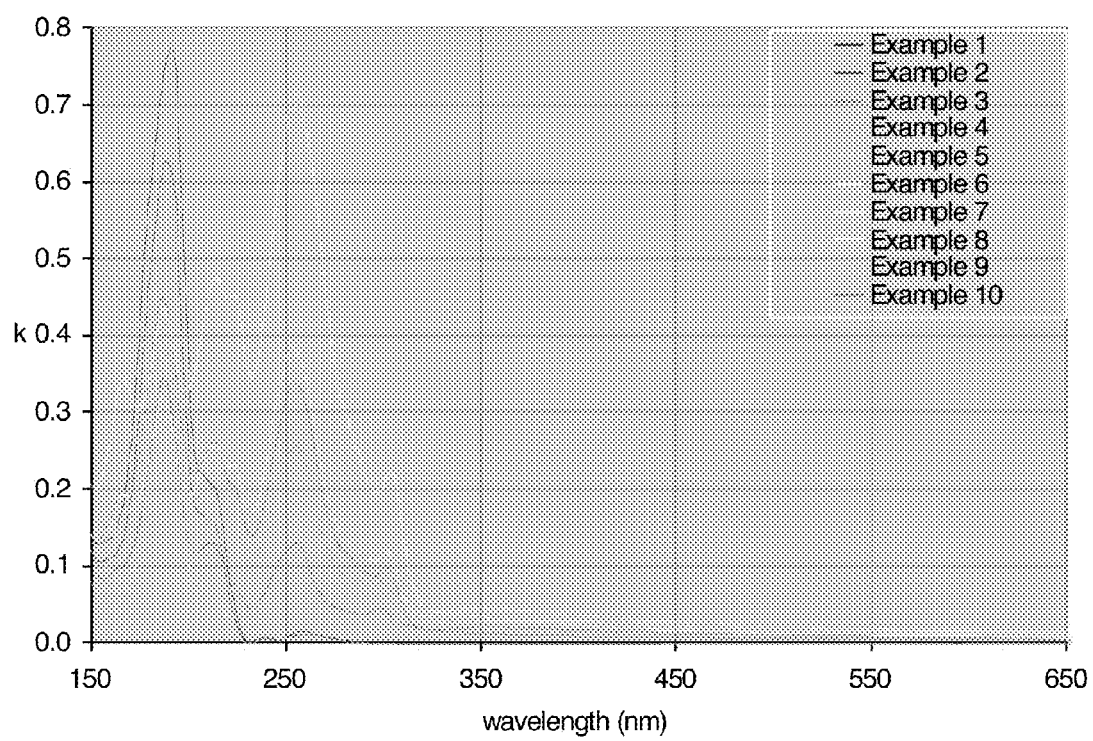
FIG. 2 shows a spectral plot of absorption co-efficient (k) as a function of wavelength (nm) for materials according to Examples 1 to 10.

Turning first to FIG. 2, where the absorption co-efficient (k) is represented as a function of wavelength, we clearly see that, depending on which chromophore molecule ($R^1$, $R^2$) is used, a specific absorption band appears at certain wavelength. In case of the materials of Examples 1, 2 and 5, the material is synthesized using only phenyl-trimethoxysilane (PTMS) and tetraethoxysilane (TEOS) as precursor molecules. The phenyl-group has its main absorption band peaking at about 189 nm wavelength. The molar-% amounts of PTMS in these compositions are 44%, 30% and 10%, respectively. At 189 nm wavelength the 44 mol-% of PTMS results in k-value of 0.7750, 30 mol-% of PTMS results in k-value of 0.6244 and 10% mol-% of PTMS in k-value of 0.3347. The higher the phenyl content the higher the absorption (k) at 189 nm. The absorption co-efficient of TEOS is about zero at these wavelengths. The material of Example 7 was synthesized using only phenanthrene-9-triethoxysilane (PhenTES) and tetraethoxysilane (TEOS) as precursor molecules. The material of Example 8 was synthesized using only Naphthalene-9-triethoxysilane (NaphTES) and tetraethoxysilane (TEOS) as precursor molecules. It can be seen from FIG. 2 that PhenTES and NaphTES have very similar absorption band structures. However, their absorption band structures differ quite considerably from PTMS.

The absorption peaks can be found at 165 nm, 186 nm, 213 nm, 223 nm and 255 nm. The highest k-values are at 255 nm. When comparing with PTMS absorption band structure it is noticed that same peak can be found with all of the three chromophores at 186-189 nm range.

Figure 3:
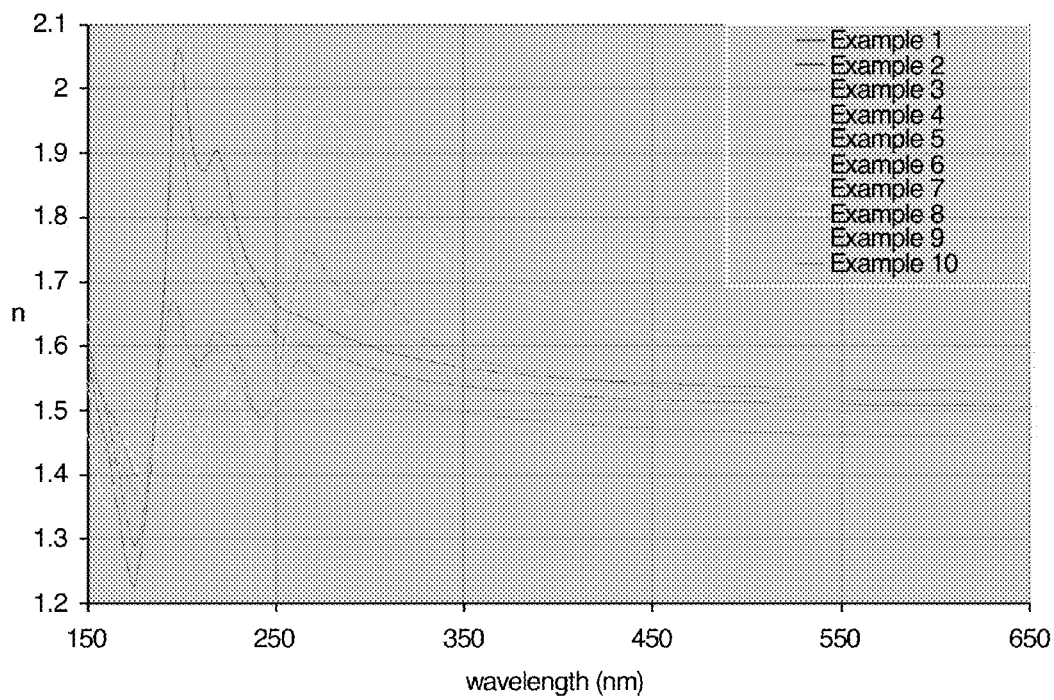
FIG. 3 shows a corresponding spectral plot of the refractive index as a function of wavelength.
Figure 4:
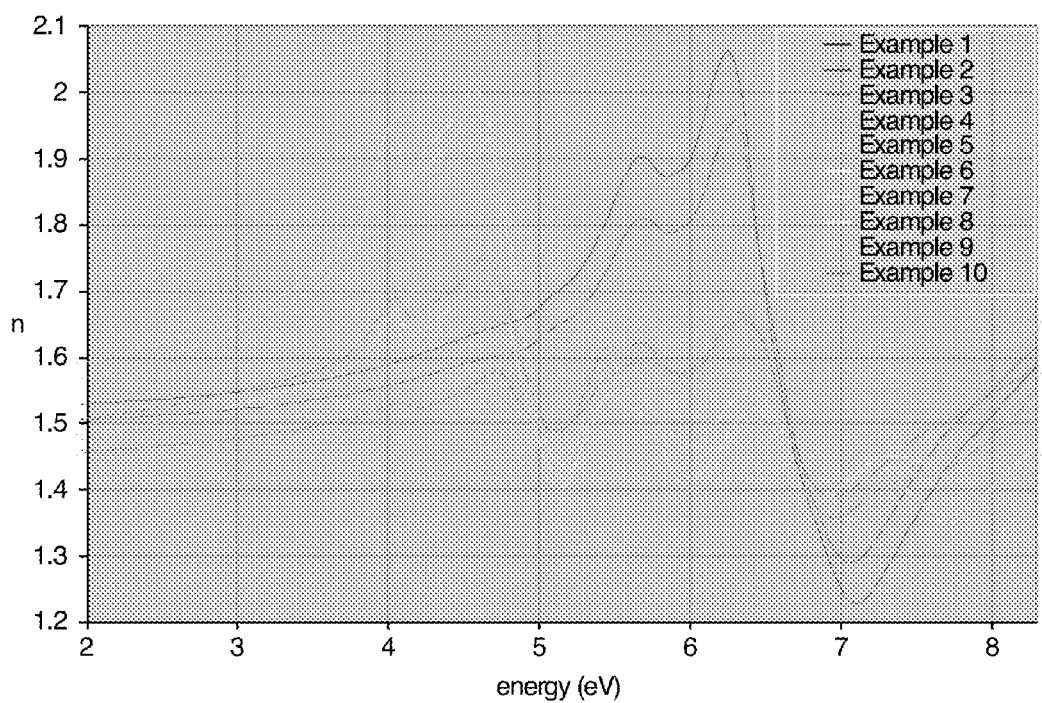
FIG. 4 is a spectral plot of refractive index (n) of the materials according to Examples 1 to 10 as a function of energy (eV); and finally
Figure 5:
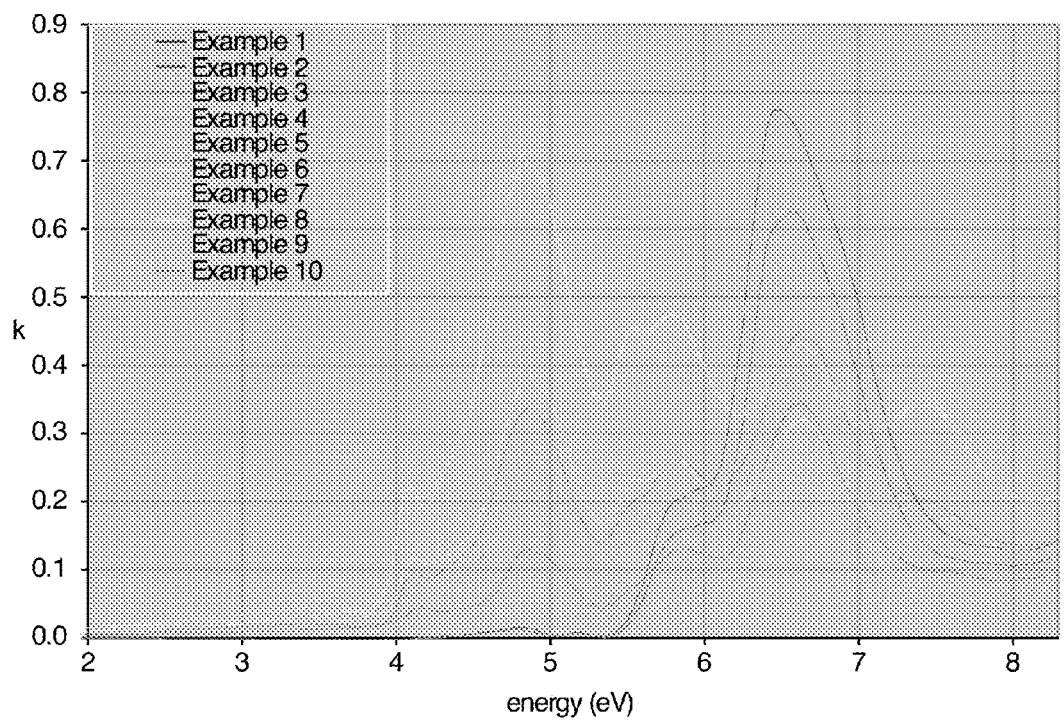
FIG. 5 is a corresponding spectral plot of absorption co-efficient (k) as a function of energy (eV).

In FIG. 3 the refractive index (n) is represented as a function of wavelength. The PTMS has its refractive index maxima at about 197 nm and 217 nm. The 44 mol-% composition has a refractive index of 2.0650 and 1.9030, respectively. The higher the phenyl content the higher the refractive index at 197 nm and 217. Again, in case of PhenTES and NaphTES, the spectral plots for refractive index are very similar to each other. However, as in the case with absorption band structures their refractive index spectral plots differ quite considerably from PTMS. The refractive index peak maxima can be found at 169 nm, 192 nm, 217 nm, 227 nm, 272 nm and 310 nm. The highest refractive index values are at 272 nm wavelength. When comparing with PTMS refractive index spectral plot it is noticed that similar peaks can be found with all of the three chromophores at 192-217 nm range.

The remaining material compositions of the examples are mixtures of two of the above mentioned chromophores in same material compositions. Depending on what wavelength range is in interest for the BARC application the Si-content, the refractive index and the k-value has to be tuned to a certain level. In making these adjustments we have found it beneficial to use more than one choromophore molecule in the synthesis of the material. It may be also beneficial to use another base matrix former molecule in the synthesis such as triethoxysilane, methyltriethoxysilane, ethyltriethoxysilane, n-butyltriethoxysilane, methyldiethoxyvinylsilane and dimethyldiethoxysilane.

The remaining examples and their explanations are discussed at 193 nm wavelength. Turning next to the materials of Examples 2 and 3, it can be noted, when comparing Examples 2 and 3, that the difference between the materials is that in material 3, 15 mol-% of the PTMS molecule was replaced with 15 mol-% of the PhenTES molecule. As expected it can be noticed that both the absorption co-efficient (k) and refractive index (n) at 193 nm wavelength drop, since the PTMS group has considerably much higher characteristic n- and k-values at that wavelength region than PhenTES. Furthermore, when comparing the materials of Examples 3 and 4, the difference between these is that in case of material of Example 4 the PTMS amount was decreased even further which results in further drop of the both k- and n-values.

Next, materials of Examples 4 and 10 can be compared. With those compositions the PTMS amount is kept constant but the PhenTES amount is lower in case of Example 10. As can be seen from the data the refractive index at 193 nm remains fairly constant but the k-value of the composition was reduced. This gives freedom to adjust the n and k values. Lastly, comparing materials of Examples 10 and 9 the difference between these is that in case of Example 9 half of the TEOS amount is replaced with methyltriethoxysilane (MeTES). Again this affects more pronouncedly lowering the k-value than the n-value. When tuning the n- and k-values to proper level one has to also consider the silicon content value at the same time to get all the parameters tuned correctly for the specific BARC application. The organic/inorganic ratio in the material defines the desired etching properties.

In the following, the invention will be illustrated with the aid of a number of working examples giving further details of the preparation of the above-discussed preferred anti-reflection coating compositions. The same numbering that is used with the examples is used in the Table 1 to indicate each sample.

Example 1

Phenyltrimethoxysilane (14.04 g, 44 mol %), tetraethoxysilane (18.78 g, 56 mol %) were weighed to a round bottom flask. 65.64 g of acetone was added to the round bottom flask. 10.34 g of water (0.01M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50° C.). After most of the acetone was removed, 72 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the material solution was refluxed at 120° C. for 2 hours. After the 2 hour refluxing step the material is ready to use after dilution and filtration. The material was diluted to 4% solid content and filtrated using 0.1 μm PTFE filter. The filtrated solution was is then dispensed on a silicon wafer and spin coated using a spinning speed of 2500 rpm for 30 s. The coated wafer was then soft baked at 140° C. for 60 seconds followed by hard baking at 250° C. for 180 seconds. The cured material film's optical properties and thickness were characterized using a GES5-PUV spectroscopic ellipsometer. The measurement was performed at an incident angle of 76 degrees. Wine used for the spectral fitting. The measured film thickness was 53.3 nm and the refractive indices (n) at 157 nm, 193 nm, 248 nm and 633 nm were 1.486, 1.839, 1.674 and 1.53, respectively. The extinction coefficients (k) at 157 nm, 193 nm, 248 nm and 633 nm were 0.1314, 0.7635, 0.0033 and 0.0006, respectively. The same deposition and curing parameters and film characterization techniques were used in all of the following examples. The measurement data for all of the examples is also summarized in Table 1.

FIGS. 1-4 represent the spectral plots of n and k as a function of wavelength (nm) and energy (eV).

Example 2

Phenyltrimethoxysilane (9.57 g, 30 mol %), tetraethoxysilane (23.46 g, 70 mol %) were weighed to a round bottom flask. 66.06 g of acetone was added to the round bottom flask. 10.75 g of water (0.01M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50C). After most of the acetone was removed, 72.07 g of PGMEA was added to the flask. The reaction mixture was evaporated further in the rotary evaporator (pressure 45 mbar, t(bath)=50 C, 1 hour) after PGMEA addition to perform a solvent exchange. After the solvent exchange the material solution was refluxed at 120 C for 2 hours. After the 2 hour refluxing step the material is ready to use after dilution and filtration. The material was diluted to 4% solid content and filtrated using 0.1 µm PTFE filter. The measured film thickness was 52.2 nm. The refractive indices (n) at 157 nm, 193 nm, 248 nm and 633 nm were 1.528, 1.813, 1.628 and 1.506, respectively. The extinction coefficients (k) at 157 nm, 193 nm, 248 nm and 633 nm were 0.107, 0.5901, 0.0011 and 0.0011, respectively.

Example 3

Phenyltrimethoxysilane (4.78 g, 15 mol %), tetraethoxysilane (23.46 g, 70 mol %) and Phenanthrene-9-triethoxysilane (8.24 g, 15 mol %) were weighed to a round bottom flask. 72.96 g of acetone was added to the round bottom flask. 10.75 g of water (0.01M HCl) was added to the reaction flask within 5 min, while constantly stirring the reaction mixture using a magnetic stirrer. After this the reaction mixture was stirred at RT for 28 min and refluxed for 5 hours using electric mantel. After the refluxing, most of the acetone was removed from the reaction mixture using a rotary evaporator (pressure 350->250 mbar, t(bath)=50° C.). After most of the acetone was removed, 72.18 g of PGMEA was added to the flask. The reaction mixture was kept further in the rotary evaporator (pressure 45 mbar, t(bath)=50° C., 1 hour) after PGMEA addition to perform a solvent exchange. After the solvent exchange the material solution was refluxed at 120 C for 2 hours. After the 2 hour refluxing step the material is ready to use after dilution and filtration. The material was diluted to 4% solid content and filtrated using 0.1 µm PTFE filter. The measured film thickness was 55.9 nm. The refractive indices (n) at 157 nm, 193 nm, 248 nm and 633 nm were 1.461, 1.649, 1.517 and 1.507, respectively. The extinction coefficients (k) at 157 nm, 193 nm, 248 nm and 633 nm were 0.1428, 0.3585, 0.2983 and 0.0067, respectively.

Example 4

Phenyltrimethoxysilane (4.36 g, 10 mol %), tetraethoxysilane (30 g, 83 mol %) and Phenanthrene-9-triethoxysilane (5.26 g, 7 mol %) were weighed to a round bottom flask. 158.5 g of acetone was added to the round bottom flask. 15.2 g of water (0.01M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50° C.). After most of the acetone was removed, 72 g of PGMEA was added to the flask. The reaction mixture was evaporated further in the rotary evaporator (pressure 45 mbar, t(bath)=50 C, 1 hour) after PGMEA addition to perform a solvent exchange. After the solvent exchange the material solution was refluxed at 120 C for 2 hours. After the 2 hour refluxing step the material is ready to use after dilution and filtration. The material was diluted to 4% solid content and filtrated using 0.1 µm PTFE filter. The measured film thickness was 41.1 nm. The refractive indices (n) at 157 nm, 193 nm, 248 nm and 633 nm were 1.483, 1.628, 1.5 and 1.475, respectively. The extinction coefficients (k) at 157 nm, 193 nm, 248 nm and 633 nm were 0.1183, 0.329, 0.2291 and 0.0062, respectively.

Example 5

Phenyltrimethoxysilane (2.60 g, 10 mol %), tetraethoxysilane (24.59 g, 90 mol %) were weighed to a round bottom flask. 54.38 g of acetone was added to the round bottom flask. 9.21 g of water (0.01M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50 C). After most of the acetone was removed, 60 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the material solution was refluxed at 120° C. for 2 hours. After the 2 hour refluxing step the material is ready to use after dilution and filtration. The material was diluted to 4% solid content and filtrated using 0.1 µm PTFE filter. The measured film thickness was 48.2 nm. Refractive index (n) at 157 nm, 193 nm, 248 nm and 633 nm were 1.581, 1.708, 1.534 and 1.459, respectively. Extinction coefficient (k) at 157 nm, 193 nm, 248 nm and 633 nm were 0.0623, 0.2568, 0.0037 and 0.0017, respectively.

Example 6

Phenyltrimethoxysilane (1.60 g, 5 mol %), tetraethoxysilane (26.81 g, 80 mol %) and Phenanthrene-9-triethoxysilane (8.24 g, 15 mol %) were weighed to a round bottom flask. 73.3 g of acetone was added to the round bottom flask. 10.75 g of water (0.01M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50° C.). After most of the acetone was removed, 72 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the material solution was refluxed at 120 C for 2 hours. After the 2 hour refluxing step the material is ready to use after dilution and filtration. The material was diluted to 4% solid content and filtrated using 0.1 µm PTFE filter. The measured film thickness was 45.5 nm and the refractive indices (n) at 157 nm, 193 nm, 248 nm and 633 nm were 1.466, 1.55, 1.471 and 1.482, respectively. Extinction coefficient (k) at 157 nm, 193 nm, 248 nm and 633 nm were 0.1352, 0.2593, 0.3501 and 0.0082, respectively.

Example 7

Phenanthrene-9-triethoxysilane (7.71 g, 60 mol %), tetraethoxysilane (3.42 g, 40 mol %) were weighed to a round bottom flask. 27.84 g of acetone was added to the round bottom flask. 2.52 g of water (0.1M HCl) was added to the reaction flask within 5 min, while constantly stirring the reaction mixture using a magnetic stirrer. After this the reaction mixture was stirred at RT for 28 min and refluxed for 5 hours using electric mantel. After refluxing the reaction solution was evaporated to dryness (Evaporation: p=200-38 mbar, t(bath)=48° C., t=10 min). After evaporation white solid product was obtained. After this a high-vacuum treatment was performed (p<1 mbar, t=RT, 60 minutes). 14.84 g of PGMEA was added and the material was ready to use after dilution and filtration. The material was diluted to 4% solid content and filtrated using 0.1 µm PTFE filter. The measured film thickness was 43.7 nm and the refractive indices (n) at 157 nm, 193 nm, 248 nm and 633 nm were 1.375, 1.507, 1.478 and 1.568, respectively. The extinction coefficients (k) at 157 nm, 193 nm, 248 nm and 633 nm were 0.2281, 0.377, 0.6417 and 0.0143, respectively.

Example 8

Naphthalene-2-triethoxysilane (10.07 g, 60 mol %), tetraethoxysilane (4.80 g, 40 mol %) were weighed to a round bottom flask. 37.18 g of acetone was added to the round bottom flask. 3.53 g of water (0.1M HCl) was added to the reaction flask within 5 min, while constantly stirring the reaction mixture using a magnetic stirrer. After this the reaction mixture was stirred at RT for 28 min and refluxed for 5 hours using electric mantel. After refluxing the reaction solution was evaporated to dryness (Evaporation: p=200-38 mbar, t(bath)=48° C., t=10 min). After evaporation white solid product was obtained. After this a high-vacuum treatment was performed (p<1 mbar, t=RT, 60 minutes). 17.52 g of PGMEA was added and the material was ready to use after dilution and filtration. The material was diluted to 4% solid content and filtrated using 0.1 μm PTFE filter. The measured film thickness was 53 nm, and the refractive indices (n) at 157 nm, 193 nm, 248 nm and 633 nm were 1.382, 1.524, 1.513 and 1.593, respectively. The extinction coefficients (k) at 157 nm, 193 nm, 248 nm and 633 nm were 0.2232, 0.3709, 0.631 and 0.013, respectively.

Example 9

Phenyltrimethoxysilane (3.19 g, 10 mol %), tetraethoxysilane (14.58 g, 43.5 mol %) methyltriethoxysilane (12.48 g, 43.5 mol %) and Phenanthrene-9-triethoxysilane (1.65 g, 3 mol %) were weighed to a round bottom flask. 63.8 g of acetone was added to the round bottom flask. 9.96 g of water (0.01M HCl) was added to the reaction flask within 5 min, while constantly stirring the reaction mixture using a magnetic stirrer. After this the reaction mixture was stirred at RT for 26 min and refluxed for 5 hours using electric mantel. After the refluxing, most of the acetone was removed from the reaction mixture using a rotary evaporator (pressure 350->250 mbar, t(bath)=50° C.). After most of the acetone was removed, 36 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the solid content of the solution was measured to be 34.21%. This solution was then further diluted to solid content of 25% (15.2 g of PGMEA was added). This reaction mixture that had a solid content of 25% was refluxed at 120° C. for 2 hours. After the 2 hour refluxing step the material is ready to use after dilution and filtration. The material was diluted to 4% solid content and filtrated using 0.1 μm PTFE filter. The measured film thickness was 50.4 nm. The refractive indices (n) at 157 nm, 193 nm, 248 nm and 633 nm were 1.596, 1.655, 1.503 and 1.459, respectively. The extinction coefficients (k) at 157 nm, 193 nm, 248 nm and 633 nm were 0.1023, 0.2366, 0.106 and 0.0034, respectively.

Example 10

Phenyltrimethoxysilane (3.19 g, 10 mol-%), tetraethoxysilane (29.16 g, 87 mol-%) and Phenanthrene-9-triethoxysilane (1.65 g, 3 mol %) were weighed to a round bottom flask. 68 g of acetone was added to the round bottom flask. 11.22 g of water (0.01M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50° C.). After most of the acetone was removed, 36 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the solid content of the solution was measured to be 35.15%. This solution was then further diluted to solid content of 25% (15.64 g of PGMEA was added). This reaction mixture that had a solid content of 25% was refluxed at 120° C. for 2 hours. After the 2 hour refluxing step the material is ready to use after dilution and filtration. The material was diluted to 4% solid content and filtrated using 0.1 μm PTFE filter. The measured film thickness was 43.0 nm and the refractive indices at 157 nm, 193 nm, 248 nm and 633 nm were 1.518, 1.635, 1.489 and 1.44, respectively. The extinction coefficients (k) at 157 nm, 193 nm, 248 nm and 633 nm were 0.085, 0.2722, 0.1137 and 0.005, respectively.

Example A

Represents the Usage of Monosilane and Carbodisilane Monomer Together

Phenyltrimethoxysilane (10 mol-%), tetraethoxysilane (87 mol-%) and 1-(9-Phenanthrenyl)-1,1,4,4,4-pentamethoxy-1,4-disilanebutane (3 mol %) were weighed to a round bottom flask. 68 g of acetone was added to the round bottom flask. 11.22 g of water (0.01M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50° C.). After most of the acetone was removed, 36 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the solid content of the solution was measured to be 35.15%. This solution was then further diluted to solid content of 25% (15.64 g of PGMEA was added). This reaction mixture that had a solid content of 25% was refluxed at 120° C. for 2 hours. After the 2 hour refluxing step the material is ready to use after dilution and filtration. The material was diluted to 4% solid content and filtrated using 0.1 μm PTFE filter. The measured film thickness was 53.0 nm and the refractive index at 193 nm was 1.635. The extinction coefficient (k) at 193 nm was 0.27.

Example B

Represents the Usage of Two Different Carbodisilane Monomers Together 1-(phenyl)-1,1,4,4,4-pentamethoxy-1,4-disilanebutane (10 mol-%), tetraethoxysilane (87 mol-%) and 1-(9-Phenanthrenyl)-1,1,4,4,4-pentamethoxy-1,4-disilanebutane (3 mol %) were weighed to a round bottom flask. 66 g of acetone was added to the round bottom flask. 11.6 g of water (0.01M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50° C.). After most of the acetone was removed, 36 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the solid content of the solution was measured to be 33%. This solution was then further diluted to solid content of 25% (14.6 g of PGMEA was added). This reaction mixture that had a solid content of 25% was refluxed at 120° C. for 2 hours. After the 2 hour refluxing step the material is ready to use after dilution and filtration. The material was diluted to 4% solid content and filtrated using 0.1 μm PTFE filter. The measured film thickness was 46.0 nm and the refractive index at 193 nm was 1.59. The extinction coefficient (k) at 193 nm was 0.23

Example C 1-(phenyl)-1,1,4,4,4-pentamethoxy-1,4-disilanebutane (10 mol %), tetraethoxysilane (43.5 mol %), methyltriethoxysilane (43.5 mol %) and 1-(9-Phenanthrenyl)-1,1,4,4,4-pentamethoxy-1,4-disilanebutane (3 mol %) were weighed to a round bottom flask. 66 g of acetone was added to the round bottom flask. 9.96 g of water (0.01M HCl) was added to the reaction flask within 5 min, while constantly stirring the reaction mixture using a magnetic stirrer. After this the reaction mixture was stirred at RT for 26 min and refluxed for 5 hours using electric mantel. After the refluxing, most of the acetone was removed from the reaction mixture using a rotary evaporator (pressure 350->250 mbar, t(bath)=50° C.). After most of the acetone was removed, 34 g of PGME was added to the flask. The reaction mixture was evaporated further in the rotary evaporator (pressure 45 mbar, t(bath)=50° C., 1 hour) after PGME addition to perform a solvent exchange. After the solvent exchange the solid content of the solution was measured to be 34%. This solution was then further diluted to solid content of 25% (15.9 g of PGME was added). This reaction mixture that had a solid content of 25% was refluxed at 120° C. for 2 hours. After the 2 hour refluxing step the material is ready to use after dilution and filtration. The material was diluted to 4% solid content and filtrated using 0.1 μm PTFE filter. The measured film thickness was 46.4 nm. The refractive index (n) at 193 nm was 1.62. The extinction coefficient (k) at 193 nm was 0.21.

Example D 1-(phenyl)-1,1,4,4,4-pentamethoxy-1,4-disilanebutane (10 mol %), tetraethoxysilane (43.5 mol %), methyltriethoxysilane (41.5 mol %) and Vinyltriethoxysilane (5 mol %) were weighed to a round bottom flask. 70 g of acetone was added to the round bottom flask. 10.4 g of water (0.01M HCl) was added to the reaction flask within 5 min, while constantly stirring the reaction mixture using a magnetic stirrer. After this the reaction mixture was stirred at RT for 26 min and refluxed for 5 hours using electric mantel. After the refluxing, most of the acetone was removed from the reaction mixture using a rotary evaporator (pressure 350->250 mbar, t(bath)=50° C.). After most of the acetone was removed, 34.7 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the solid content of the solution was measured to be 34%. This solution was then further diluted to solid content of 25% (16.9 g of PGMEA was added). This reaction mixture that had a solid content of 25% was refluxed at 120° C. for 2 hours. After the 2 hour refluxing step the material is ready to use after dilution and filtration. The material was diluted to 4% solid content and filtrated using 0.1 μm PTFE filter. The measured film thickness was 46.4 nm. The refractive index (n) at 193 nm was 1.65. The extinction coefficient (k) at 193 nm was 0.21.

Example E 1-(phenyl)-1,1,4,4,4-pentamethoxy-1,4-disilanebutane (7.5 mol %), tetraethoxysilane (59 mol %), methyltriethoxysilane (32.5 mol %) and 1-(9-Phenanthrenyl)-1,1,4,4,4-pentamethoxy-1,4-disilanebutane (1 mol %) were weighed to a round bottom flask. 59 g of acetone was added to the round bottom flask. 8.5 g of water (0.01M HCl) was added to the reaction flask within 5 min, while constantly stirring the reaction mixture using a magnetic stirrer. After this the reaction mixture was stirred at RT for 26 min and refluxed for 5 hours using electric mantel. After the refluxing, most of the acetone was removed from the reaction mixture using a rotary evaporator (pressure 350->250 mbar, t(bath)=50° C.). After most of the acetone was removed, 33 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the solid content of the solution was measured to be 35%. This solution was then further diluted to solid content of 25% (15.9 g of PGMEA was added). This reaction mixture that had a solid content of 25% was refluxed at 120° C. for 2 hours. After the 2 hour refluxing step the material is ready to use after dilution and filtration. The material was diluted to 4% solid content and filtrated using 0.1 μm PTFE filter. The measured film thickness was 46.4 nm. The refractive index (n) at 193 nm was 1.66. The extinction coefficient (k) at 193 nm was 0.17.

Example F 1-(phenyl)-1,1,4,4,4-pentamethoxy-1,4-disilanebutane (7.5 mol %), tetraethoxysilane (59 mol %), methyltriethoxysilane (33.5 mol %) were weighed to a round bottom flask. 58 g of acetone was added to the round bottom flask. 8.3 g of water (0.01M HCl) was added to the reaction flask within 5 min, while constantly stirring the reaction mixture using a magnetic stirrer. After this the reaction mixture was stirred at RT for 26 min and refluxed for 5 hours using electric mantel. After the refluxing, most of the acetone was removed from the reaction mixture using a rotary evaporator (pressure 350->250 mbar, t(bath)=50° C.). After most of the acetone was removed, 32 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the solid content of the solution was measured to be 35%. This solution was then further diluted to solid content of 25% (14.9 g of PGMEA was added). This reaction mixture that had a solid content of 25% was refluxed at 120° C. for 2 hours. After the 2 hour refluxing step the material is ready to use after dilution and filtration. The material was diluted to 4% solid content and filtrated using 0.1 μm PTFE filter. The measured film thickness was 46.4 nm. The refractive index (n) at 193 nm was 1.67. The extinction coefficient (k) at 193 nm was 0.16

Additional Examples

In addition, it possible to modify the carbosilane/silane polymer materials obtained from the above examples by blending or further co-polymerizing with other monomers, oligomers, polymers, or additives. These monomers, oligomers, polymers and or additives can be either organic, silane, carbosilane or other types of materials. These additives can have a range of molecular weights and have different types of reactive sites or capping groups that suit for the specific surfaces and compositions. By utilizing the blending or further co-polymerization it is possible to improve the compositions compatibility (such as adhesion properties) to different substrate (meaning various possible device layers) and photoresist material layer surfaces.

Example G

The material from Example F is blended with 10 weight-% of polyethylene oxide polymer. The blending is carried out by dissolving the polyethylene oxide polymer to the 25% solid content PGMEA solution. This blended solution is then further formulated to a 4% solid content, filtrated using 0.1 µm PTFE filter and is ready for usage and deposition.

Example H

The material from Example F is blended with 10 weight-% of pre-polymerized trimethylolpropane triacrylate polymer. The pre-polymerized acrylate polymer is blended by dissolving it into the 25% solid content PGMEA solution of material obtained from Example F. This blended solution is then further formulated to a 4% solid content, filtrated using 0.1 µm PTFE filter and is ready for usage and deposition.

Example I

The material from Example F is blended with 20 weight-% of commercially available hydrogen silsesquioxane polymer (Dow Corning, Fox series). The blending is carried out by dissolving the hydrogen silsesquioxane polymer to the 25% solid content PGMEA solution of material obtained from Example F. This blended solution is then further formulated to a 4% solid content, filtrated using 0.1 µm PTFE filter and is ready for usage and deposition.

Example J

The material from Example F is blended with 20 weight-% of epoxy functionalized siloxane polymer. The siloxane polymer is obtained by hydrolysing and further condensation polymerizing the (3-Glycidyloxypropyl)trimethoxysilane, methyltriethoxysilane and phenyltrimethoxysilane monomers in presence of solvent and acid catalyst. The resulting siloxane/silane polymer is blended by dissolving this silane polymer to the 25% solid content PGMEA solution of material obtained from Example F. This blended solution is then further formulated to a 4% solid content, filtrated using 0.1 µm PTFE filter and is ready for usage and deposition.

Examples G-J represent some of the options for blending. Other different type of additives with different compositions can be used depending on the requirements case by case. Furthermore, the monomers, oligomers, polymer, or other additives can be optionally co-polymerized through specific reactive functional groups to the material matrix if it is preferred.

While the present invention has been illustrated and described with respect to a particular embodiment thereof, it should be appreciated by those of ordinary skill in the art that various modifications to this invention may be made without departing from the spirit and scope of the present.

What is claimed is:

1. A method of producing a silicon polymer material, which has a silicon polymer backbone with chromophore groups attached directly to at least a part of the silicon atoms, the polymer further exhibiting carbosilane bonds, comprising the steps of reacting at least one monomer having Formula I, II or V $$R^1\!-\!R^4\!-\!SiX_3 \qquad \qquad I$$

$$R^1SiX_2\!-\!R^4\!-\!SiX_3 \qquad \qquad II$$

$$R^1{}_a SiX'_{4-a} \qquad \qquad V$$

wherein $R^1$, $R^2$, $R^3$ and $R^4$ are independently and optionally substituted by one or several substituents selected from fluoro, bromo, $C_{1-10}$-alkyl, $C_{1-10}$-alkoxy, $C_{2-10}$-alkenyl, $C_{6-18}$-aryl, acryl, epoxy, carboxyl and carbonyl groups and/or an alkoxycarbodisilane, acyloxycarbodisilane, or chlorocarbodisilane having at least one hydrocarbon group attached directly to one of the two Si atom of carbodisilane which hydrocarbon group includes an aromatic ring, optionally with at least one monomer of formulas III, IV or VI $$R^2\!-\!R^4\!-\!SiX_3 \qquad \qquad III$$

$$R^2SiX_2\!-\!R^4\!-\!SiX_3 \qquad \qquad IV$$

$$R^2{}_b SiX'_{4-b} \qquad \qquad VI$$

wherein
   $R^1$ stands for a chromophore group;
   $R^2$ is selected from the group consisting of hydrogen, linear and branched alkyl and cycloalkyl, alkenyl, alkynyl, (alk)acrylate and alkoxy and aryl having 1 to 6 rings,
   $R^4$ stands for an optionally bivalent hydrocarbon linker selected from an alkylene group, an arylene group, and a polycyclic group;
   each X and X' represents independently a hydrolysable group or a hydrocarbon residue; and
   each a and b are independently an integer 1 to 3,
   in the presence of a solvent and a catalyst and recovering the reaction product, comprising the steps of:
   forming a reaction mixture of the monomers and a first solvent;
   subjecting the monomers in the presence of a catalyst and a first solvent to hydrolysis to form a first product;
   removing the first solvent from the reaction mixture and adding a second solvent; and
   subjecting the first product to condensation polymerization in the second solvent to obtain a condensation product having a higher molecular weight than the first product.

2. The method according to claim 1, wherein the second solvent has a higher boiling point than the first solvent and wherein the condensation polymerization is carried out at a higher temperature in the second solvent than in the first solvent.

* * * * *